United States Patent [19]
Nakagawa et al.

[11] Patent Number: 5,105,243
[45] Date of Patent: Apr. 14, 1992

[54] CONDUCTIVITY-MODULATION METAL OXIDE FIELD EFFECT TRANSISTOR WITH SINGLE GATE STRUCTURE

[75] Inventors: Akio Nakagawa, Hiratsuka; Yoshihiro Yamaguchi, Urawa; Kiminori Watanabe, Kawasaki, all of Japan

[73] Assignee: Kabushiki Kaisha Toshiba, Kawasaki, Japan

[21] Appl. No.: 399,342

[22] Filed: Aug. 25, 1989

Related U.S. Application Data

[63] Continuation-in-part of Ser. No. 233,425, Aug. 18, 1988, abandoned, which is a continuation-in-part of Ser. No. 160,277, Feb. 25, 1988, abandoned.

[30] Foreign Application Priority Data

| Feb. 26, 1987 | [JP] | Japan | 62-41309 |
| May 8, 1987 | [JP] | Japan | 62-110743 |
| Dec. 3, 1987 | [JP] | Japan | 62-304634 |
| Aug. 10, 1988 | [JP] | Japan | 63-199538 |
| Jan. 27, 1989 | [JP] | Japan | 1-18309 |
| Jul. 21, 1989 | [JP] | Japan | 1-187393 |

[51] Int. Cl.$^5$ .................................. H01L 29/78
[52] U.S. Cl. .................. 357/23.4; 357/23.8; 357/38; 357/39; 357/41
[58] Field of Search .......... 357/23.4, 23.8, 38, 357/43, 41, 39

[56] References Cited

U.S. PATENT DOCUMENTS

| Re. 32,784 | 11/1988 | Nakagawa et al. | 357/23.4 |
| 4,072,975 | 2/1978 | Ishitani | 357/23.4 |
| 4,364,073 | 12/1982 | Becke | 357/23.4 |
| 4,589,004 | 5/1986 | Yasuda et al. | 357/23.4 |
| 4,626,879 | 12/1986 | Colak | 357/23.4 |
| 4,672,407 | 6/1987 | Nakagawa et al. | 357/23.4 |
| 4,680,604 | 7/1987 | Nakagawa et al. | 357/23.4 |
| 4,689,647 | 8/1987 | Nakagawa et al. | 357/23.4 |
| 4,734,752 | 3/1988 | Liu et al. | 357/23.4 |
| 4,761,679 | 8/1988 | Stupp | 357/23.4 |
| 4,782,372 | 11/1988 | Nakagawa et al. | 357/23.4 |
| 4,851,888 | 7/1989 | Ueno | 357/23.4 |
| 4,857,977 | 8/1989 | Temple | 357/39 |
| 4,857,983 | 8/1989 | Baliga et al. | 357/39 |
| 4,901,127 | 2/1990 | Chow et al. | 357/23.4 |
| 4,926,074 | 5/1990 | Singer et al. | 357/23.4 |
| 4,933,740 | 6/1990 | Baliga et al. | 357/23.4 |

FOREIGN PATENT DOCUMENTS

| 0280535 | 8/1988 | European Pat. Off. | 357/23.4 |
| 0224269 | 6/1987 | Fed. Rep. of Germany | 357/23.4 |
| 0023277 | 2/1977 | Japan | 357/23.4 |
| 58-97866 | 6/1983 | Japan | 357/23.4 |
| 60-196974 | 10/1985 | Japan | 357/23.4 |
| 60-254658 | 12/1985 | Japan | 357/23.4 |
| 61-82477 | 4/1986 | Japan | 357/23.4 |
| 61-123184 | 6/1986 | Japan | 357/23.4 |

OTHER PUBLICATIONS

"Improved COMFETs with Fast Switching Speed and High-Current Capability" A. M. Goodman et al., RCA Laboratories, Princeton, NJ 08540 and RCA Solid State Division, Mountainton, PA 18707, CH1973-7/83/00-00-0079, 1983 IEEE.
IEEE Transactions on Electron Devices, vol. ED-33, No. 12, Dec. 1986 "n-Channel Lateral Insulated Gate Transistors: Part I-Steady-State Characteristics", Deva N. Pattanayak et al., 0018-9383/86/1200-1956.

*Primary Examiner*—Rolf Hille
*Assistant Examiner*—Steven Loke
*Attorney, Agent, or Firm*—Oblon, Spivak, McClelland, Maier & Neustadt

[57] ABSTRACT

There is disclosed a single-gate type conductivity-modulation field effect transistor having a first base layer, a second base layer, and a source layer formed in the second base layer. A source electrode is provided on a surface of the first base layer, for electrically shorting the second base layer with the source layer. A drain layer is provided in the first base layer surface. A drain electrode is formed on the layer surface to be in contact with the drain layer. A gate electrode is insulatively provided above the layer surface, for covering a certain surface portion of the second base layer which is positioned between the first base layer and the source layer to define a channel region below the gate electrode. A heavily-doped semiconductor layer is formed in the drain layer to have the opposite conductivity type to that of the drain layer. This semiconductor layer is in contact with the drain electrode. When the transistor is turned off, this layer facilitates carriers accumulated in the first base layer to flow into the drain electrode through the drain layer, thereby accelerating dispersion of the carriers in said transistor.

12 Claims, 17 Drawing Sheets

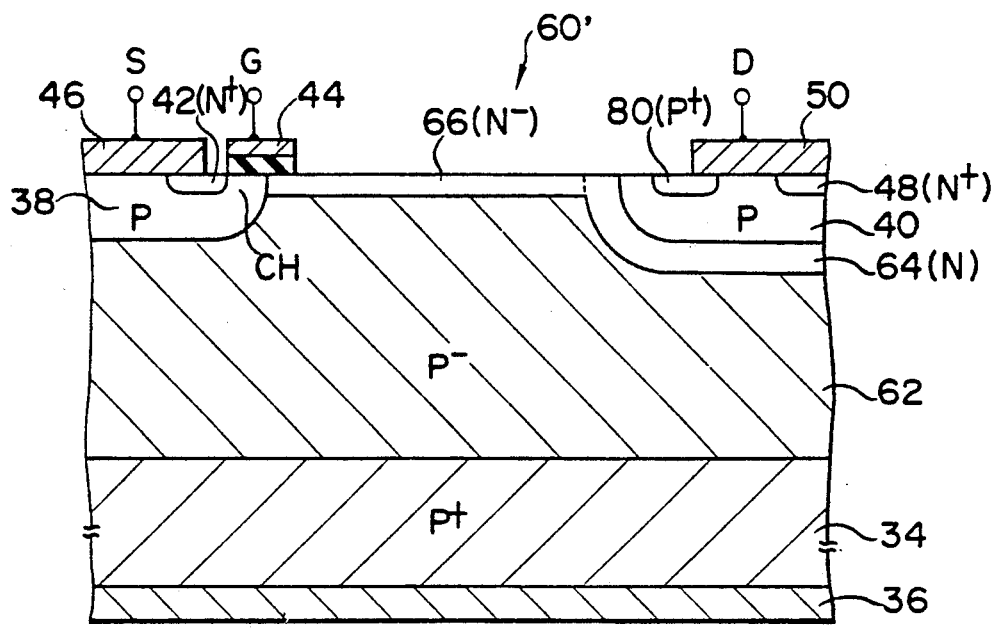
F I G. 13
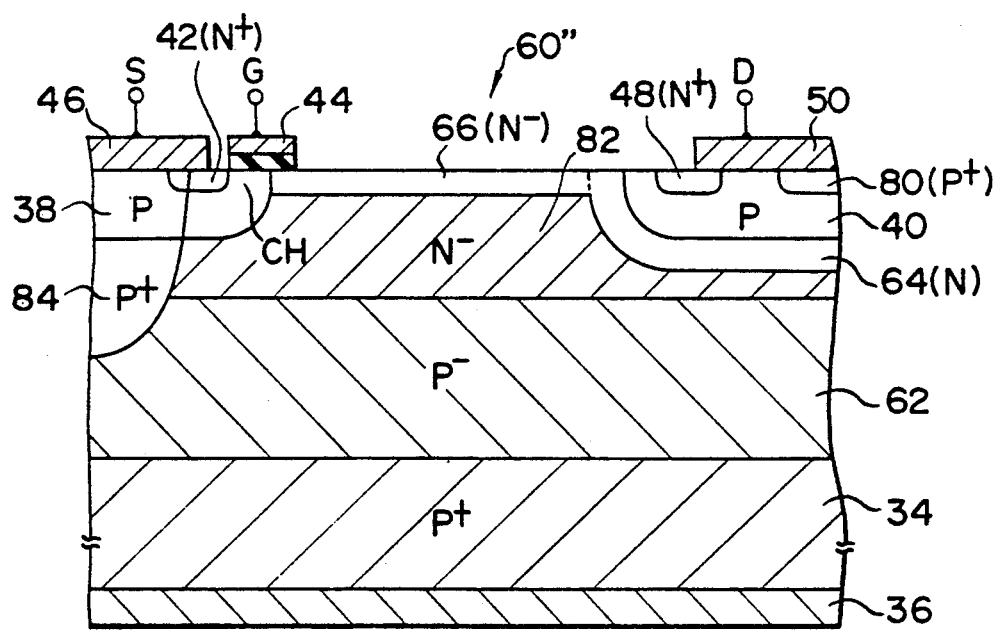
F I G. 14

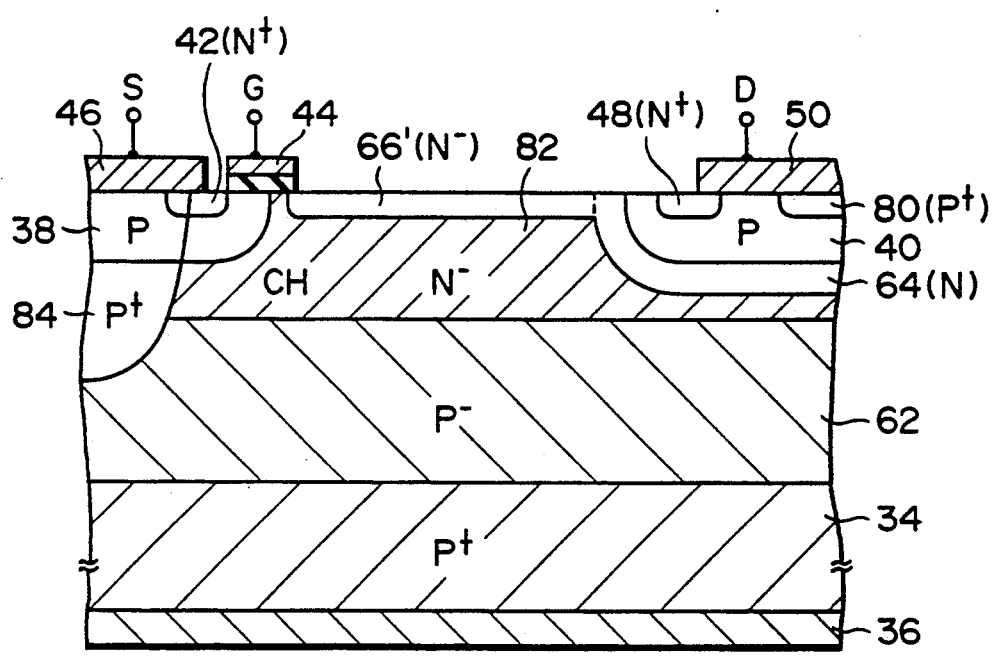
F I G. 15

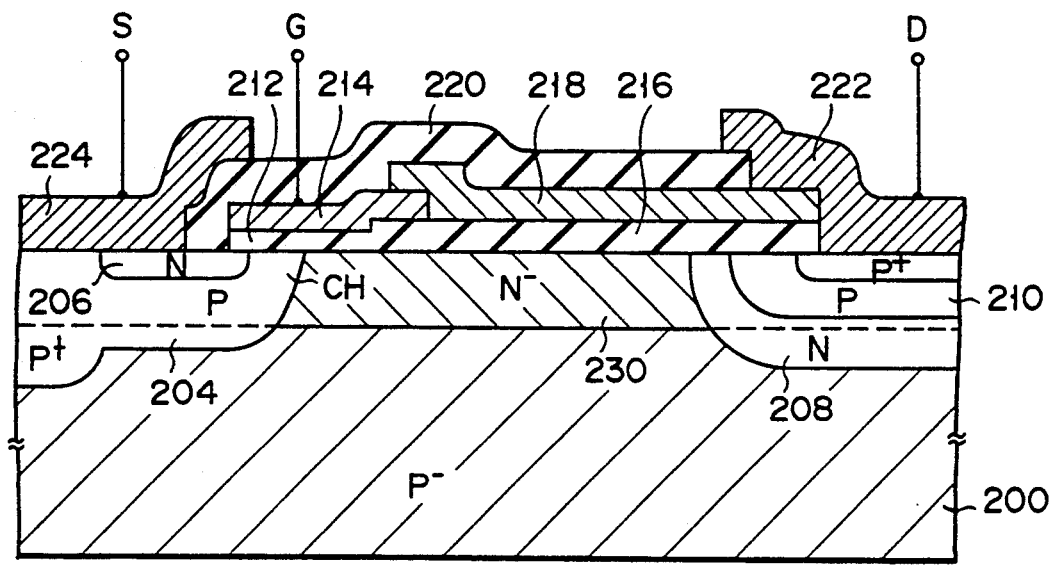
F I G. 23
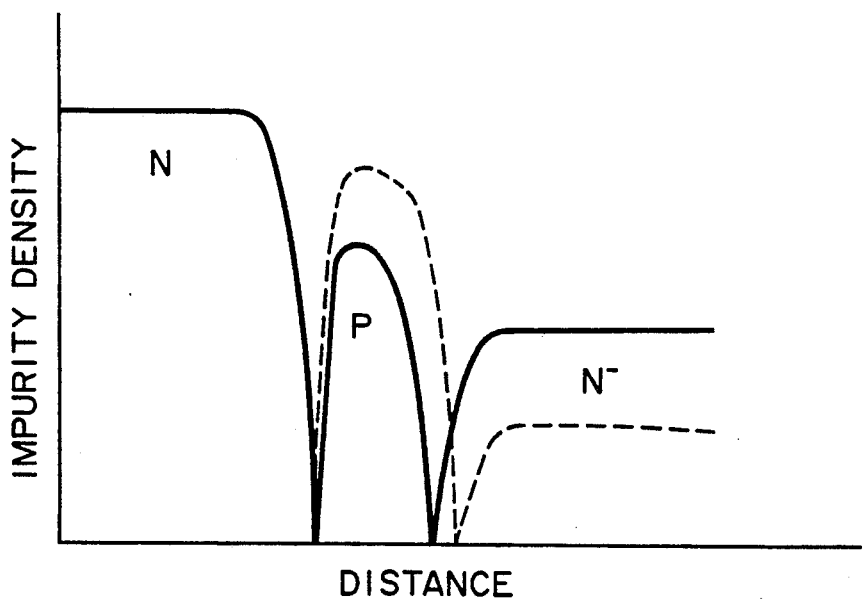
F I G. 24

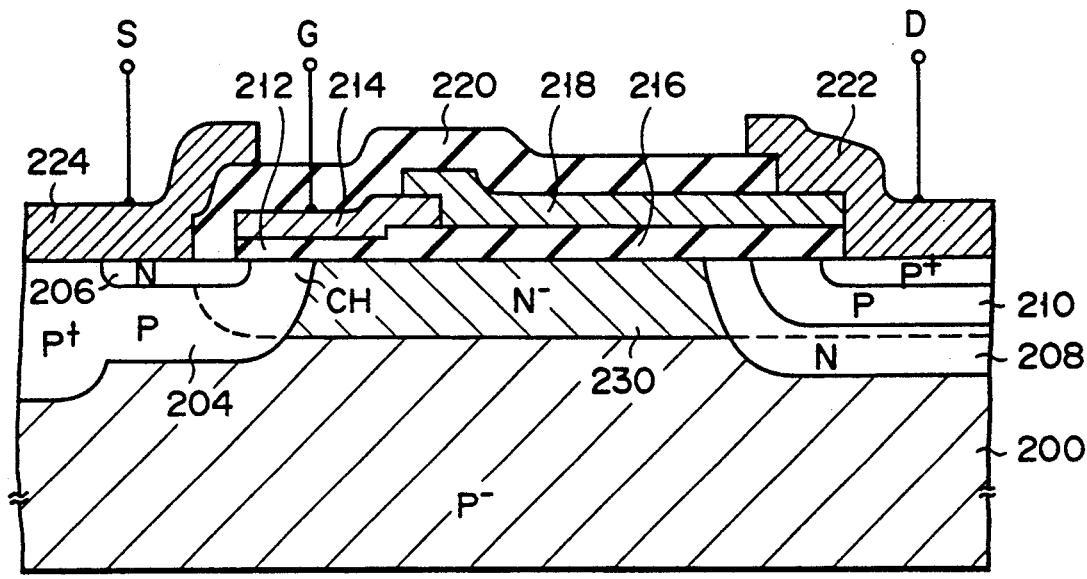
F I G. 25
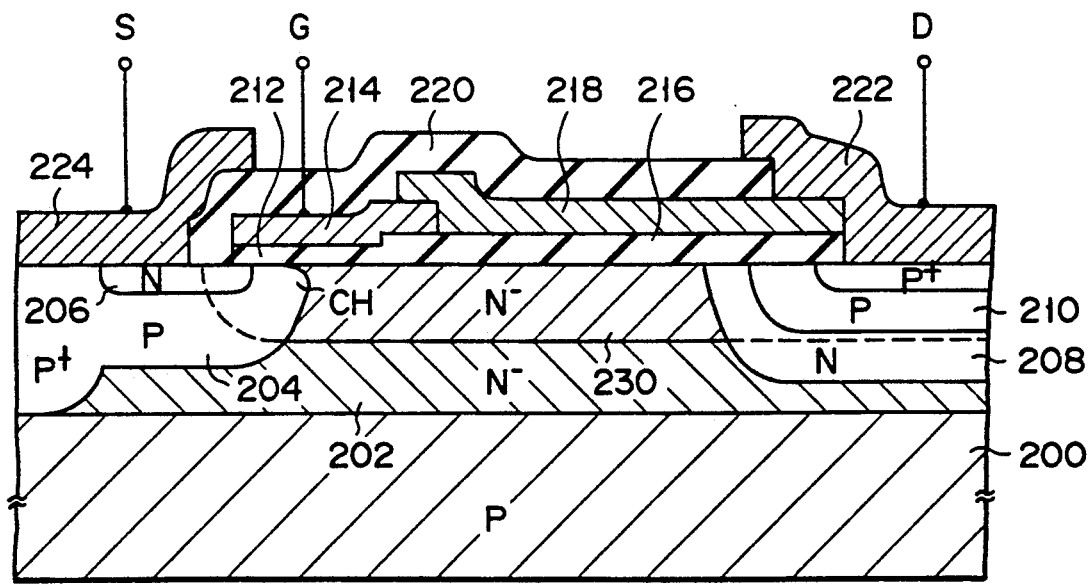
F I G. 26

CONDUCTIVITY-MODULATION METAL OXIDE FIELD EFFECT TRANSISTOR WITH SINGLE GATE STRUCTURE

This application is a continuation-in-part application of the co-pending U.S. patent application Ser. No. 233,425 filed on Aug. 18, 1988 (now abandoned) which is a continuation-in-part of co-pending U.S. patent application Ser. No. 160,277 filed on Feb. 25, 1988, now U.S. Pat. No. 4,980,743.

BACKGROUND OF THE INVENTION

1. Field of the Invention

The present invention relates to metal insulator semiconductor field effect transistors and, more particularly, to an improvement of a conductivity-modulation MOSFET.

2. Description of the related art

A conductivity-modulation MOSFET has a semiconductive drain layer, an N type conductivity base layer (N base region), and a base layer (P base region) of P type conductivity. The P base layer is formed by diffusion in an N type semiconductive layer serving as the N base layer. A heavily-doped N type layer (N+ layer) is formed on the P base layer to define a channel region of the MOSFET. A gate electrode layer insulatively covers the N base layer and the channel region, and a source electrode layer electrically shorts the P base layer and the N+ source layer. When a positive voltage is applied to the gate electrode, the channel region is inverted, so that carriers (electrons) are injected from the N+ source layer into the N base layer. When the electrons enter the drain layer through the N base layer, the PN junction of the MOSFET is forward-biased, and as a result, the MOSFET is turned on. When a zero or negative voltage is applied to the gate electrode, the inverted layer in the channel region disappears, and hence, the channel disappears. As a result the MOSFET is turned off.

In order to improve a turn-off switching speed of such a conductivity-modulation MOSFET, carriers accumulated in the N base layer thereof must disappear faster. However, with a conventional conductivity-modulation MOSFET, if the carrier lifetime in the N base layer is shortened in order to improve the turn-off speed, a voltage in the device becomes undesirably high, which leads to the difficulty in turn-on drive of the MOSFET.

SUMMARY OF THE INVENTION

It is therefore an object of the present invention to provide an improved conductivity-modulation field effect transistor.

It is another object of the present invention is to provide a new and improved conductivity-modulation field effect transistor which can increase a turn-off switching speed while an on-state voltage thereof is kept lowered.

In accordance with the above objects, the present invention is addressed to a specific semiconductor device, which has a semiconductive substrate, and a single-gate type conductivity-modulation field effect transistor formed on the substrate. The transistor has a first base layer, a second base layer, and a source layer formed in the second base layer. A source electrode is provided on a surface of the first base layer, for electrically shorting the second base layer with the source layer. A drain layer is provided in the first base layer surface. A drain electrode is formed on the layer surface to be in contact with the drain layer. A gate electrode is insulatively provided above the layer surface, for covering the certain surface portion of the second base layer which is positioned between the first base layer and the source layer to define a channel region below the gate electrode. A heavily-doped semiconductor layer is provided in a selected surface portion of the drain layer to have the opposite conductivity type to that of the drain layer. This semiconductor layer is included in the drain layer to be in contact with the drain electrode. The heavily-doped semiconductor layer facilitates, when the transistors is turned off, carriers accumulated in the first base layer to flow into the drain electrode through the drain layer, thereby accelerating dispersion of the carriers in said transistor, so that the aforementioned objects ca be attained.

The invention, and its objects and advantages, will become more apparent in the detailed description of preferred embodiments presented below.

BRIEF DESCRIPTION OF THE DRAWINGS

In the detailed description of a preferred embodiment of the invention presented below, reference is made to the accompanying drawings of which:

FIG. 13 is a diagram showing a sectional structure of a main part of a modification of the embodiment shown in FIG. 5; and FIG. 14 is a diagram showing a sectional structure of a main part of another modification of the embodiment shown in FIG. 5;

FIG. 15 is a diagram showing a sectional structure of a modification of MOSFET shown in FIG. 14;

FIG. 23 is a diagram showing a sectional view of the main part of an improved lateral type conductivity modulation MOSFET;

FIG. 24 is a graph showing impurity distribution characteristic of the MOSFET shown in FIG. 23; and FIGS. 25 and 26 are diagrams showing modifications of the MOSFET shown in FIG. 23.

DETAILED DESCRIPTION OF THE PREFERRED EMBODIMENTS

Prior to description of embodiments of the present invention, a conductivity-modulation MOSFET (also known as a "bipolar mode MOSFET") of single gate type will be described with reference to FIG. 1, for the sake of easy understanding of this invention.

Figure 1:
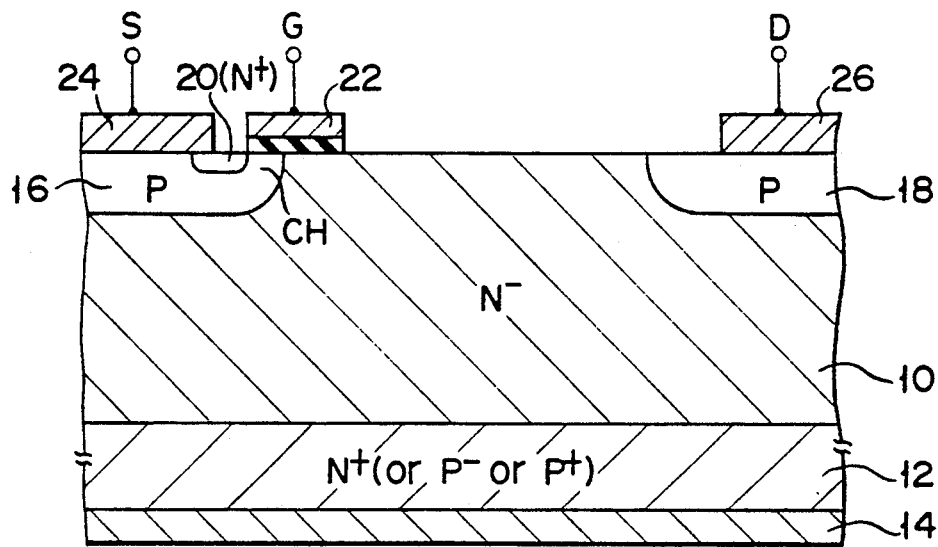
FIG. 1 is a diagram showing a basic cross-sectional structure of a conductivity-modulation MOSFET of single gate type.
Figure 2:
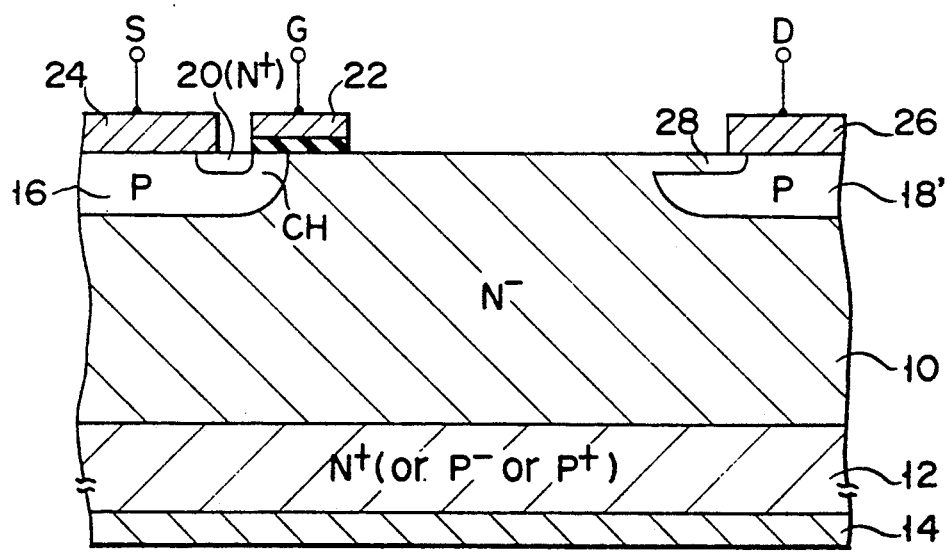
FIG. 2 is a diagram showing a cross-sectional structure of another conductivity-modulation MOSFET of single gate type.

As shown in FIG. 1. a horizontal single-gate conductivity-modulation MOSFET has typically a lightly-doped N type conductivity (N⁻ type) epitaxial layer 10, which is formed in a heavily-doped N type (N⁺ type) silicon substrate 12 to serve as a base layer of the MOSFET. Electrode layer 14 is formed on the rear surface of wafer substrate 12.

P type diffusion layers 16, 18 are formed in N base layer to serve as P base and P drain layers, respectively. N⁺ type source layer 20 is formed in P base layer 16 to define channel region CH. Gate electrode 22 is insulatively disposed above substrate 10 so as to cover this channel region CH. Source electrode 24 is deposited on layer 10 to render layers 16, 20 electrically conductive to each other. Drain electrode 26 is deposited on layer 10 to provide the "horizontal single-gate structure", wherein the source, drain and gate layers are concentrated on the same surface of wafer substrate 12.

When gate 22 is positively biased with respect to source electrode 24, the MOSFET is turned on. The physical mechanism of the MOSFET is as follows. When gate electrode 22 is applied with a positive voltage, channel CH is inverted, and electrons are injected from source 16 into N⁻ base 10 through channel CH. When electrons enter P drain 18, the PN junction of the MOSFET is forward-biased. Holes are then injected from P drain 18 into N base 10. As a result, both the electrons and holes are stored or accumulated in N⁻ base 10, thus inducing conductivity modulation. Even when the resistance of N⁻ base 10 is relatively high in order to obtain high withstand voltage characteristic, the resistance of N⁻ base 10 is decreased upon turn-on of the MOSFET due to the conductivity modulation, so that a forward voltage (turn-on voltage) is decreased. When gate electrode 22 is biased to zero or negative with respect to source 20, the inverted layer being formed in channel CH disappears, and the MOSFET is turned off.

According to this MOSFET, in order to improve the turn-off switching speed, carriers accumulated in N⁻ base 10 should disappear as rapid as possible. Unless electrons in N⁻ base 10 are rapidly drained into P drain 18, a PNP transistor constituted by P drain 18, N base 10 and P base 16 begins to operate, and a large tail current flows through the MOSFET. It is desirable, in order to achieve rapid disappearance of carriers in N base 10, that a carrier lifetime is shortened. However, in this case, an on-state voltage (turn-on voltage) necessary to turn on the MOSFET is undesirably increased to cause its turn-on characteristic to be degraded. Due to this reason, the improvement of the turn-off switching speed and the decrease in turn-on voltage cannot be realized.

To improve the rapid disappearance of accumulated carriers in N base 10, we have been proposed, in the prior U.S. patent application Ser. No. 160,277, a device wherein P drain 18 is modified such that N type diffusion layer 28 is additionally formed therein so as to cause drain electrode 26 to be partially shorted to N⁻ base layer 10. This structure is what well call "anode-short" structure. With such a structure, the tail current may be decreased in the turn-off switching mode of the MOSFET. In this case, however, the turn-on voltage is undesirably increased, since the hole injection between P drain 18 and N base 10 is limited to degrade the conductivity modulation in the MOSFET.

The aforementioned conflicting problems in the conventional conductivity-modulation MOSFET ca be eliminated effectively by embodiments of the present invention, which are presented below.

Figure 3:
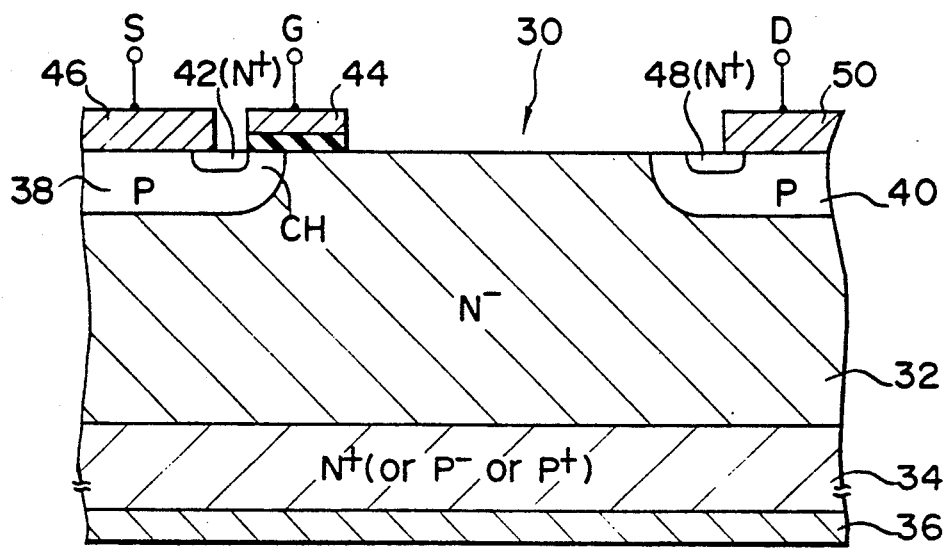
FIG. 3 is a diagram showing a sectional structure of a main part of a conductivity-modulation MOSFET of single gate type according to a preferred embodiment of the present invention.

Referring now to FIG. 3, a horizontal type conductivity-modulation MOSFET having a single gate structure in accordance with one preferred embodiment is designated generally by reference numeral "30".

As shown in FIG. 3, MOSFET 30 has a lightly-doped N type conductivity (N⁻ type) epitaxial layer 32 of high resistance, which is formed in one surface portion of heavily-doped N type (N⁺ type) wafer substrate 34 and serves as a first base (N base) layer of MOSFET 30. Electrode layer 36 is formed on the rear surface of substrate 34. P type diffusion layers 38, 40 are provided in the other surface (front surface) portion of substrate 34 in such a manner as to be formed in N base layer 32 to thereby serve as P base and P drain layers, respectively. N⁺ type diffusion layer 42 is formed in P base layer 38 to serve as a source, which defines channel region CH in P base layer 38. Gate electrode 44 is insulatively disposed above N base layer 32 so as to cover channel region CH Source electrode 46 is deposited on the front surface of substrate 34 in such a manner that it is positioned on P base 38, whereby P base layer 38 and N⁺ source layer 42 are in ohmic contact with each other. N⁺ type diffusion layer 48 is additionally formed in P drain layer 40. Drain electrode 50 is deposited on the same substrate surface, such that P drain layer 40 and N⁺ diffusion layer 48 are in ohmic contact with each other.

To turn on MOSFET 30, a positive voltage is applied to the gate terminal G connected to gate electrode 44, thereby biasing electrode 44 positively with respect to source 42. When gate electrode 44 is thus inverted electronically. As a result of this electrons current flows through N⁻ base 32 to P drain 40. At this time, holes are injected into N⁻ base layer 32, whereby conductivity modulation is accomplished.

When a great current flows in N- base layer 32, and the carrier density in this layer 32 increases above the impurity concentration of P drain layer 40, the efficiency of the hole injection from P drain layer 40 into N base layer 32 decreases. As a result of this, the electrons injected in N− base layer 32 move through P drain layer 40 into N diffusion layer 48 formed in P drain layer 40. When the concentration of the carriers in N base layer 32 is lower than the impurity concentration of P drain layer 40, then the electrons are injected from layer 32 into P drain layer 40. In this case, holes are injected into N− base layer 32. A low on-state voltage can, therefore, be generated for the same reason as in the ordinary MOSFET described above.

To turn off MOSFET 30, a negative voltage is applied to gate terminal G connected to gate electrode 44, thus biasing electrode 44 negatively with respect to source 42. Alternatively, source 42 is zero-biased, while no voltage may be applied to gate electrode 44 at all, thereby to turn of MOSFET 30. When MOSFET 30 is biased in this way, electrons are no longer injected from N+ source layer 42 into N− base layer 32, or vice versa. Under this condition, the electrons accumulated in the device are discharged to N+ diffusion layer 48 until the density of electrons in N− base layer 32 decreases to a predetermined value. The holes move via P base layer 38 into source electrode 46. This specific physical mechanism serves to raise the turn-off switching speed of MOSFET 30.

Figure 4:
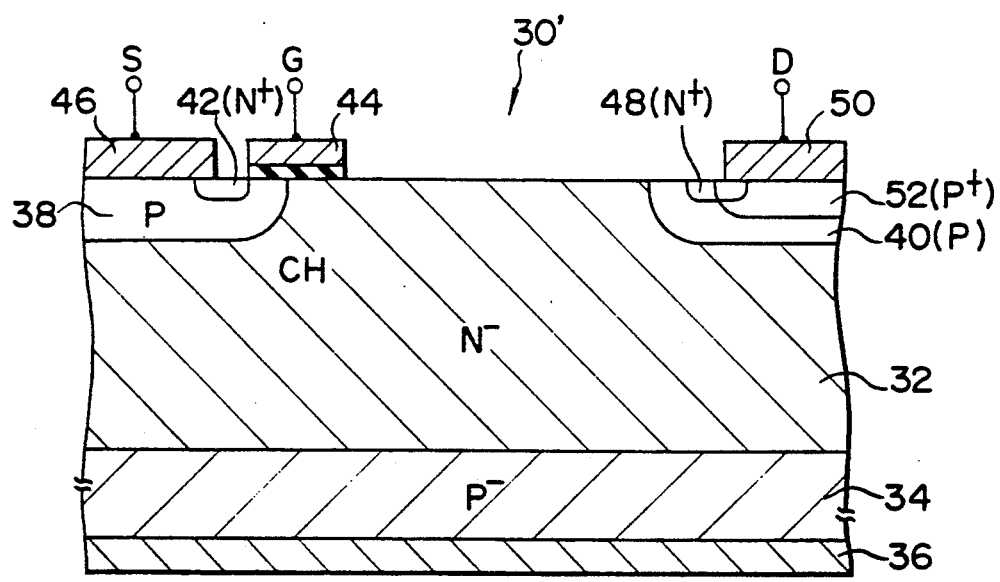
FIG. 4 is a diagram showing a sectional structure of a main part of a conductivity-modulation MOSFET of single gate type which is a modification of the MOSFET shown in FIG. 3.

As is shown in FIG. 4, MOSFET 30 may be modified to have P+ diffusion layer 52 formed in P drain layer 40 and partly overlapping N+ diffusion layer 48. If this is the case, the P drain of MOSFET 30' is made of P diffusion layer 40 and P+ diffusion layer 52. The use of P+ diffusion layer 52 promotes the injection of holes from P drain layer 40 into N base layer 32. In other words, the efficiency of the conductivity modulation is enhanced. The enhancement of the conductivity-modulation efficiency contributes to the reduction of the on-state voltage of MOSFET 30.

Figure 5:
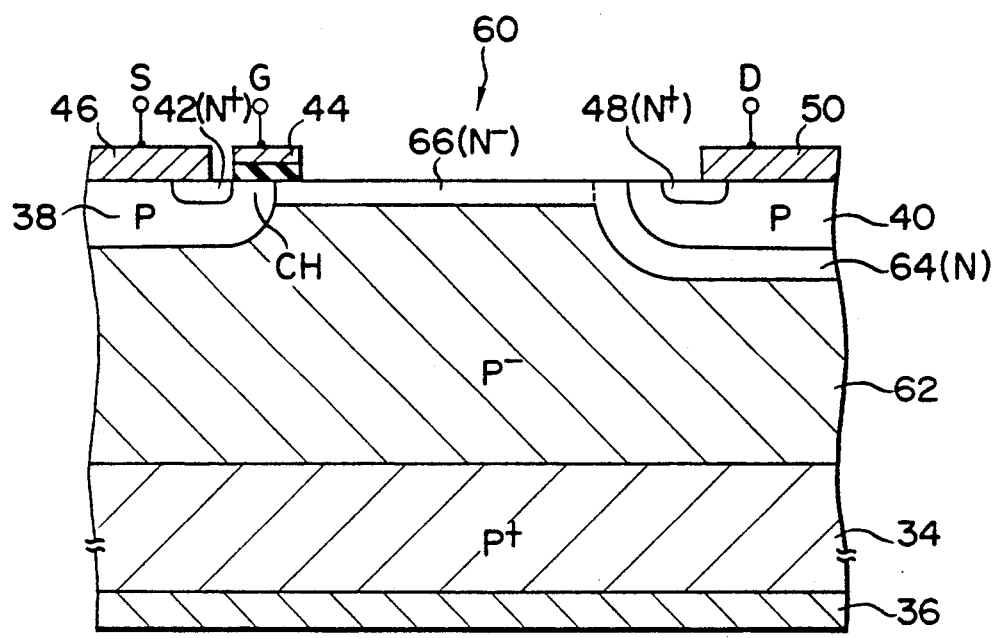
FIG. 5 is a diagram showing a sectional structure of a main part of a conductivity-modulation MOSFET according to a second embodiment of the present invention.

FIG. 5 shows MOSFET 60 of conductivity-modulation type, which is a second embodiment of the present invention. This MOSFET 60 has P− type layer 62 instead of N− type layer 32. This layer 62 may be formed by using epitaxial method in wafer substrate 34. For the simplicity of description, the same numerals are used in FIG. 5, designating the same elements as those of the embodiments described above, and these elements will now be described in detail.

As is shown in FIG. 5, substrate 34 in which epitaxial layer 62 is formed is of P+ conductivity type. N type diffusion layer 64 is formed in P− layer 62 and surrounds P drain layer 40, thus electrically isolating layer 40 from layer 62. Layer 64 will hereinafter called "drain-isolating diffusion layer" or, "N buffer layer." In other words, P drain layer 40, which contains N+ layer 48, is formed within N buffer layer 64.

N− type shallow diffusion layer 66 is formed in the surface portion of P− layer 62. N− type shallow layer 66 defines a unction at one end with P base layer 38, and defines a junction at the other end with drain-isolating layer 64 which surrounds P drain layer 40. The one end of N− shallow layer 66 may be modified such that it is not direct contact with P base layer 38 and that it is positioned in the vicinity thereof. Shallow layer 66 acts as an N base into which electrons are injected from N+ source layer 42. The experiments conducted by the inventors hereof has demonstrated that the FET had the highest withstand voltage and the lowest turn-off resistance when layer 66 had a total impurity amount of about $5 \times 10^{11}$ to $2 \times 10^{12}$ cm$^{-2}$.

Figure 6:
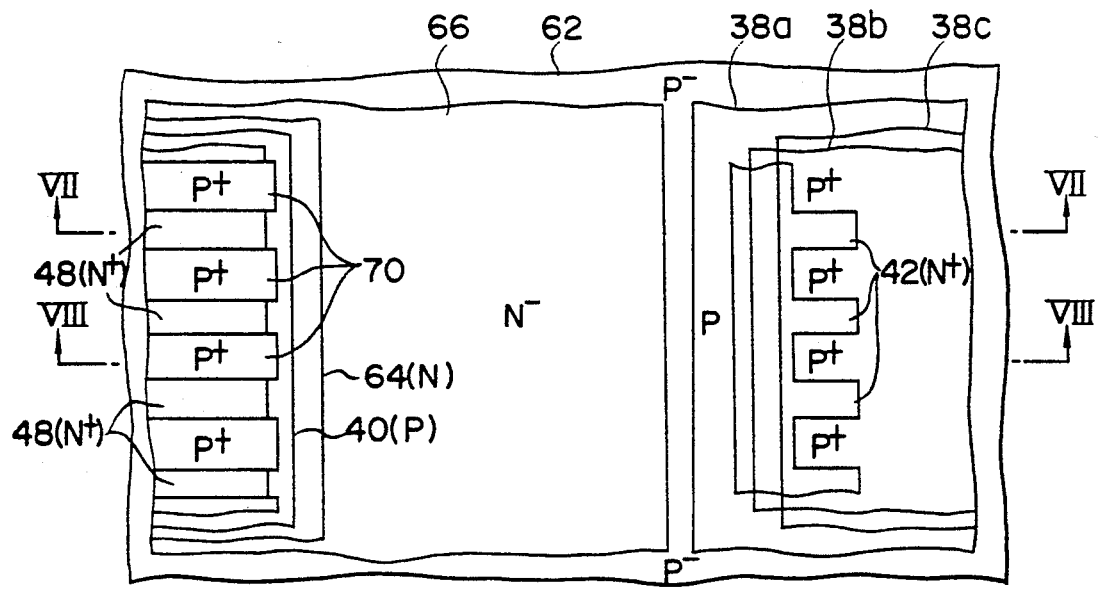
FIG. 6 is a diagram showing a plan view of a main part of a conductivity-modulation MOSFET in accordance with a third embodiment of this invention.
Figure 7:
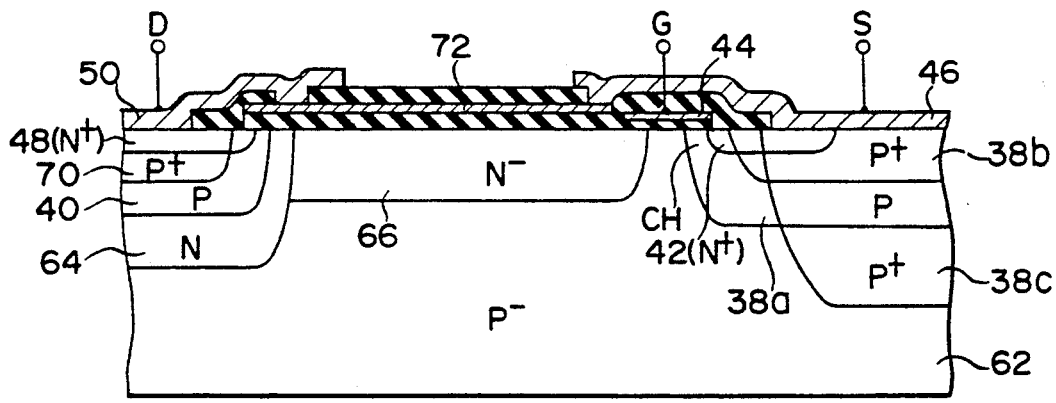
FIGS. 7 and 8 are diagrams showing sectional structures taken along different cutting lines of the MOSFET of FIG. 6.
Figure 8:
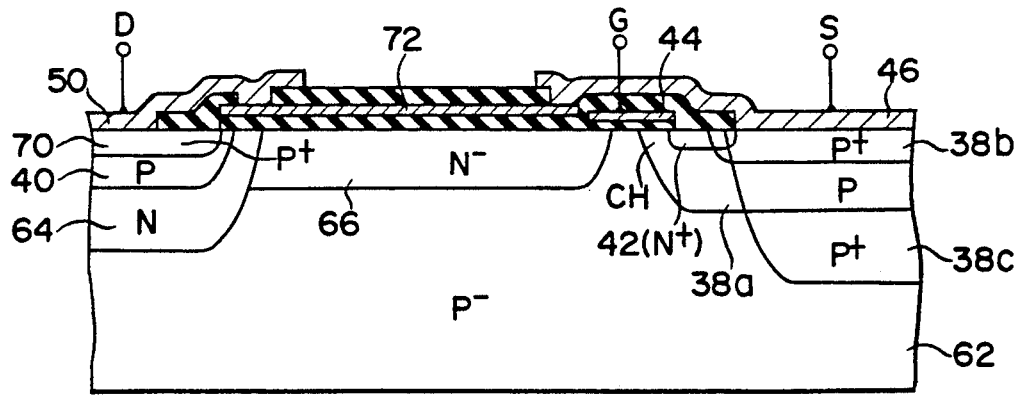

An embodiment shown in FIG. 6, has the same basic structure as in the prior embodiment of FIG. 5, wherein N− shallow diffusion layer 66 is formed in P− silicon layer 62, and P drain layer 40 and N+ source layer 48 are formed in N diffusion layer 64. For the sake of easy visual understanding of FIG. 6, electrodes provided to respective portions are omitted, and only diffusion layers are visible in the illustration. FIG. 7 shows a sectional structure taken along a line VII—VII in FIG. 6, whereas FIG. 8 presents a sectional structure taken along a line VIII—VIII in FIG. 6. In these figures, the same reference numerals denote the same portions as in FIG. 5, and the detailed description thereof will be omitted.

According to this embodiment, as shown in FIG. 6, N+ source diffusion layer 90 is formed in such a manner that it is divided into a plurality of layers by P type diffusion layers 70, which serve as a part of a drain diffusion layer. In other words, layer portions of N+ source layer 48 are discontinuously aligned in P drain layer 40. As a result, the efficiency of hole injection from P drain 40 when this MOSFET is turned on can be improved, and hence, the turn-on voltage thereof can be lowered.

It should be noted in this embodiment that high resistive layer 72 is insulatively provided above N− diffusion layer 66, as shown in FIGS. 7 and 8. Source electrode 46 and drain electrode 50 are entered to be connected with high resistive layer 72. When the MOSFET is turned off, a very small current flows through layer 72. An internal electric field in P− substrate 62 may be moderated, thus preventing local concentration of electric field. It should be further noted that, as illustrated on the right portion of FIG. 6, N+ source layer 42 is formed on a side opposite to channel region CH to have a specific plan configuration of comb-shaped pattern. With such an arrangement, electrical contact characteristic of source electrode 46 with respect to N+ source layer 42 can be improved.

Figure 9:
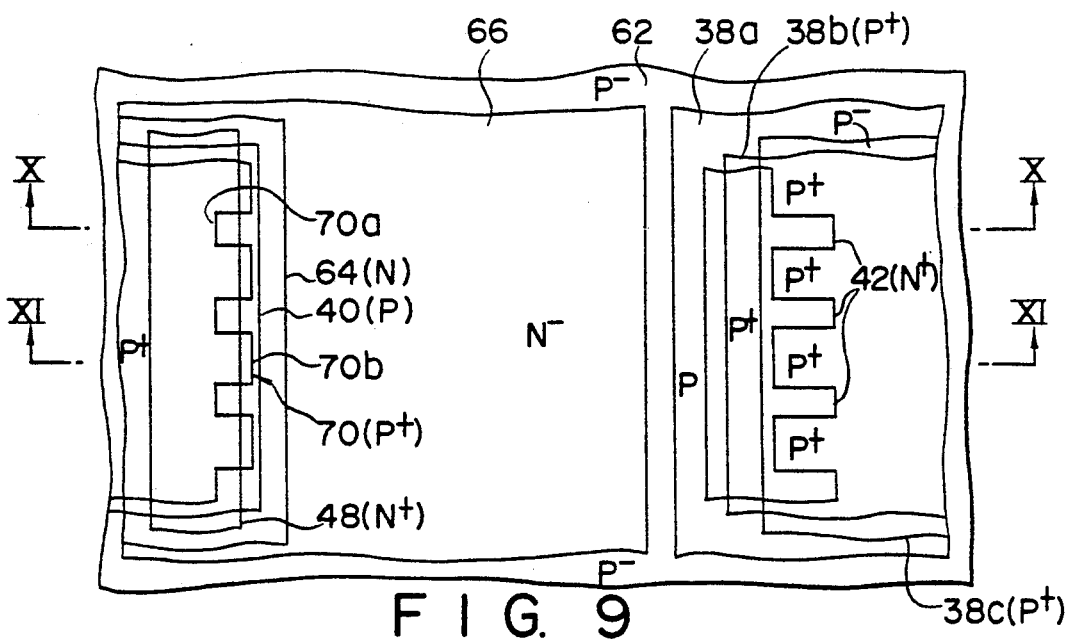
FIG. 9 is a diagram showing a plan view of a main part of a conductivity-modulation MOSFET in accordance with a fourth embodiment of this invention.
Figure 10:
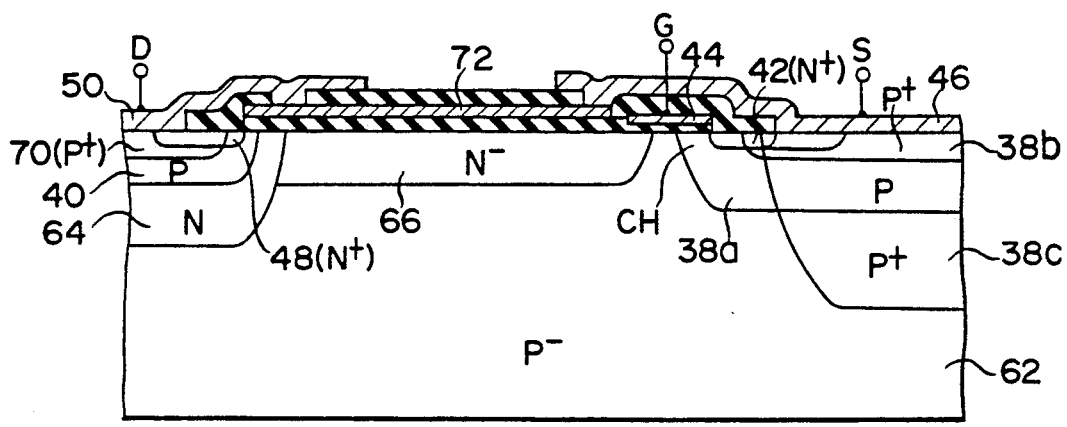
FIGS. 10 and 11 are diagrams showing sectional structures taken along different cutting lines of the MOSFET of FIG. 9.
Figure 11:
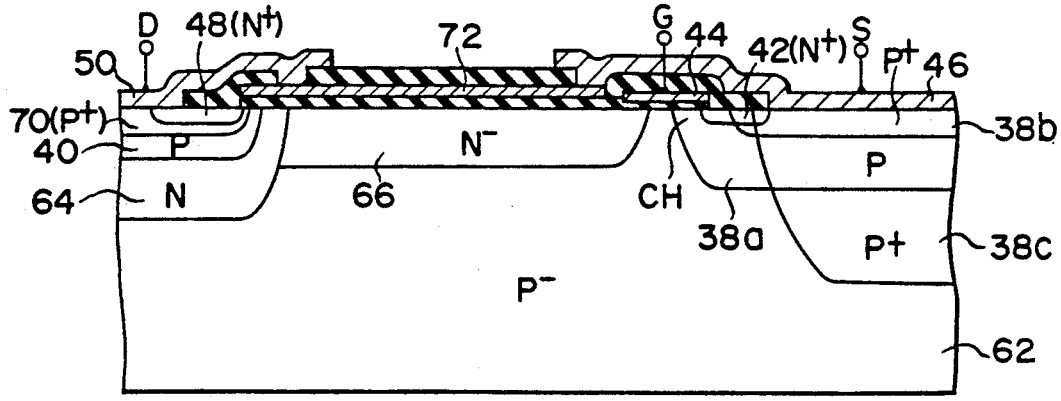

The aforementioned embodiment may be modified such that N+ source layer 48 has a specific pattern as shown in FIG. 9, wherein N+ source layer 48 is integrally formed, and P+ type layer 70 serving as a part of drain has a comb-like shape pattern. More specifically, P+ type layer 70 has recess portions 70a, the end portion of which is located inside N+ source layer 48, and projection portions 70b the rend portion of which is positioned at a certain position defined between the end of N+ source layer 48 and that of N+ drain separation layer 64. These rectangular edge portions 70a, 70b are alternately arranged, as illustrated in FIG. 9. Lightly-doped areas and heavily-doped areas are thus defined, in a layer portion positioned between source layer 48 and drain separation layer 64, so as to be alternately aligned. With such an arrangement, electrical contact characteristic of source electrode 46 with respect to N+ source layer 42 can be improved due to the same reason described before.

Figure 12:
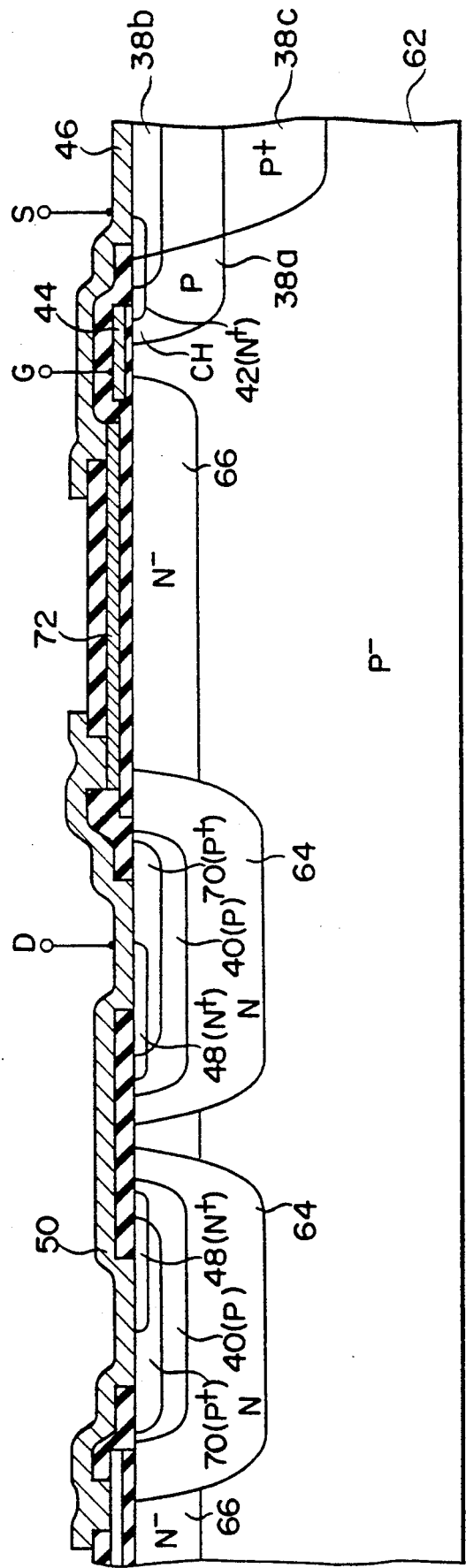
FIG. 12 is a diagram showing a sectional structure of a main part of a fifth embodiment of this invention.

According to a fifth embodiment shown in FIG. 12, N+ diffusion layer 48 is formed in P drain layer 40 so as to be positioned at an end portion thereof which is opposite to P base layer 38a. P+ layer 70 is formed in P drain layer 40 so as to be positioned at the other end portion thereof which is close to P base layer 38a. High resistive layer 72 is provided between source electrode 46 and drain electrode 50 in the same manner as described above. With such a structure, when the MOSFET is turned on, holes can be effectively injected from P+ layer 70 into N drain isolation diffusion layer 64 and N− layer 66, to thereby provide a lowered turn-on voltage of the MOSFET. It should be noted that drain separation layers 64 may be formed integrally in layer 62.

Although the invention has been described with reference to specific embodiments, it shall be understood by those skilled in the art that numerous modifications may be made that are within the strip and scope of the inventive contribution.

For example, the MOSFET shown in FIG. 5 may be modified as shown in FIG. 13 or 14. In a modification of FIG. 13, P+ type diffusion layer 80 may be formed in P drain layer 40 so as to replace N+ layer 48, which is moved in layer 40 to another substrate surface position fully covered by drain electrode 50. With such a structure, substantially the same effects may be obtained: the hole injection efficiency is also improved. The positions of layers 48 and 80 may be changed as illustrated in FIG. 14. Further, in this modification, N− type layer 82 is epitaxially formed in the front surface portion of layer 62 so as to include therein layers 38, 64, 66. With such an arrangement, it is necessary from P drain layer 40 to have an impurity concentration of $1 \times 10^{16}$ to $3 \times 10^{17}$ cm$^{-3}$ in the specific region thereof which is positioned just under N+ layer 48, in order to improve the switching speed of the MOSFET. The aforementioned device structure may be further modified such that it is formed in a single-crystalline silicon island which is surrounded by a silicon oxide layer. In such a case, electrode layer 36 may be omitted.

The MOSFET shown in FIG. 14 may also be modified as shown in FIG. 15, wherein an N− type shallow diffusion layer 66 is isolated from a P base layer 38.

Figure 16:
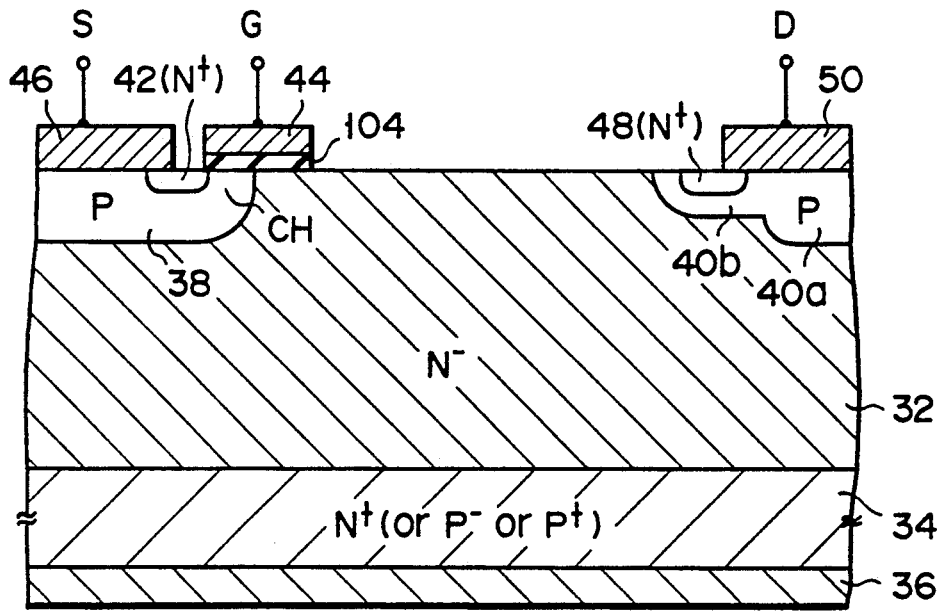
FIG. 16 is a diagram showing a sectional structure of a modification of MOSFET shown in FIG. 3.

The MOSFET shown in FIG. 3 may be modified as shown in FIG. 16, wherein a P type drain layer 40 consists of a P type diffusion layer 40a having a normal depth and a shallow P type diffusion layer 40b which surrounds an N+ layer 48. These layers 40a and 40b overlap each other and are integrally formed.

As described above, in order to improve the carrier injection efficiency of an N− type base layer 32 as compared with a dose of an impurity contained in the P type drain layer 40, an impurity dose in a partial region in the P drain layer 40 sandwiched by the internal N+ diffusion layer 48 and the N− type base layer 32 must be set to be $5 \times 10^{15}$ ions/cm$^2$ or less, and preferably within the range of $1 \times 10^{13}$ ions/cm$^2$ to $5 \times 10^{13}$ ions/cm$^2$. As shown in the embodiment in FIG. 3, however, when a structure obtained by forming the P drain layer 40 in only one diffusion step, and forming the N+ diffusion layer 48 in the P drain layer 40 is employed, it is extremely difficult to preferably set the impurity dose of the partial region of the P drain layer 40 located immediately under the N+ diffusion layer 48 as described above for the following reasons.

When an element is in an on-state, its ON voltage can be decreased due to the injection of holes from the P drain layer 40. It is a typical and effective means for facilitating such carrier injection to increase sufficiently the total amount of impurity of the P drain layer 40. More specifically, in order to provide sufficient hole injection, it should be required for the layer 40 that the surface impurity density thereof is at least $5 \times 10^{19}$ cm$^3$ and that the depth of the layer 40 is 2 micrometers or more. If the N+ layer 48 is formed using the conventional impurity diffusion process to control successfully the amount of impurity in the aforementioned partial region of the P drain layer 40, it will be required that the depth of the N+ layer 48 is large enough to obtain the increased degree of impurity density of the layer 40. Such a special condition for formation of the N+ layer 48 does not allow formation of the layer 48 together with an N+ source layer 42 by a single diffusion step. If the P drain layer 40 is simply formed together with the N+ source layer 42 by a single diffusion step, controllability of the impurity dose of the above partial region is degraded. In contrast, according to the embodiment of FIG. 16, the P drain layer 40 consists of the two isolating layers 40a and 40b. Therefore, the above-mentioned conflicting technical problems can be solved simultaneously. Such a "two separate P drain" feature can be similarly applied to the embodiments shown in FIG. 6 to 11.

A method of manufacturing the two separate P drain layers 40a and 40b shown in FIG. 16 will be described hereinafter with reference to FIGS. 17A through 17F.

Figure 17A:
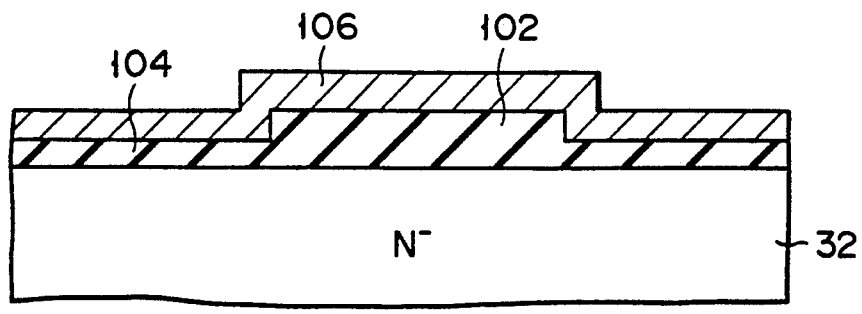
FIGS. 17A and 17F are diagrams showing some sectional structures obtained in the main steps of a manufacturing process of the MOSFET shown in FIG. 16.

As shown in FIG. 17A, after an N− type base layer 32 is epitaxially formed on a wafer substrate 34 (not shown in FIG. 17A: see FIG. 16), an oxide film 102 having a large thickness is formed. The oxide film 102 is partially subjected to selective etching to define a thin oxide film 104 serving as a gate insulation layer. As a result, an insulation layer structure having a stepped top surface configuration (thickness) can be obtained. As shown in FIG. 17A, a polysilicon layer 106 serving as a gate electrode 44 (G) is deposited on the resultant structure.

Figure 17B:
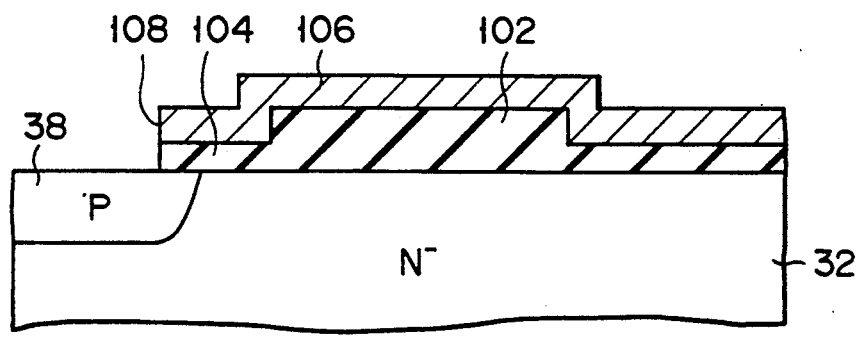

As shown in FIG. 17B, the structure thus obtained is subjected to selective etching, and hence an opening 108 is defined in the layers 104 and 106. Using remaining layer portions of the layers 104 and 106 as a mask, a P type impurity e.g., boron ions are implanted in the N− type base layer 32, thus forming the P base layer 38 in the N− type base layer 32.

Figure 17C:
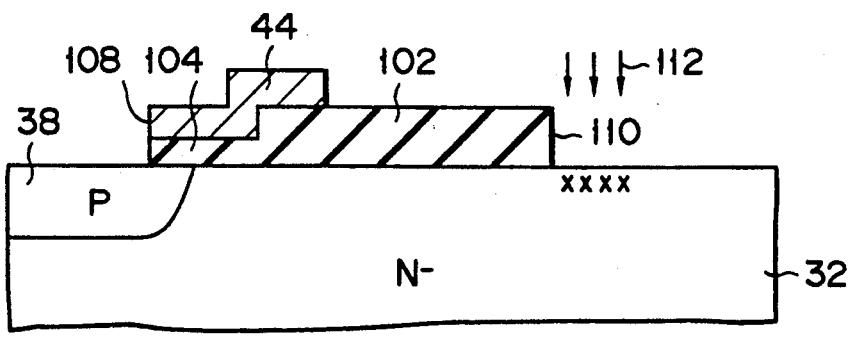

As shown in FIG. 17C, the opposite portion of the polysilicon layer 106 is selectively etched to form the gate electrode 44 (G). The opposite portion of the oxide film 102 is also selectively etched to define another opening 110. As indicated by arrows 112, boron ions are implanted in the top surface of the N− type base layer 32 externally exposed by the opening 110. In FIG. 17C, marks "x" indicate a boron implantation region (i.e., a prospective drain region) in the layer 32 for the sake of clarity. The boron ions are lightly doped. As a result, as shown in FIG. 17D, the shallow P drain layer 40b is formed.

Figure 17D:
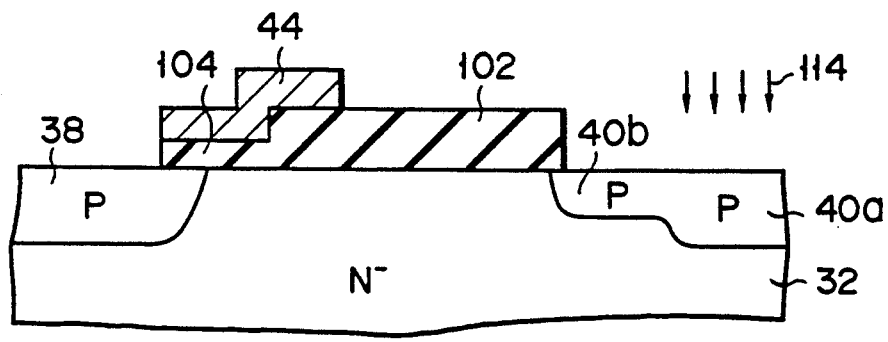

As shown in FIG. 17D, boron ions are implanted in a surface region adjacent to the top surface of the N− type base layer 32 at an increased dose, as indicated by arrows 114. As a result, the deep P drain layer 40a which overlaps the layer 40b is formed in the layer 32. The layer 32 is annealed to obtain the P drain layer 40.

Figure 17E:
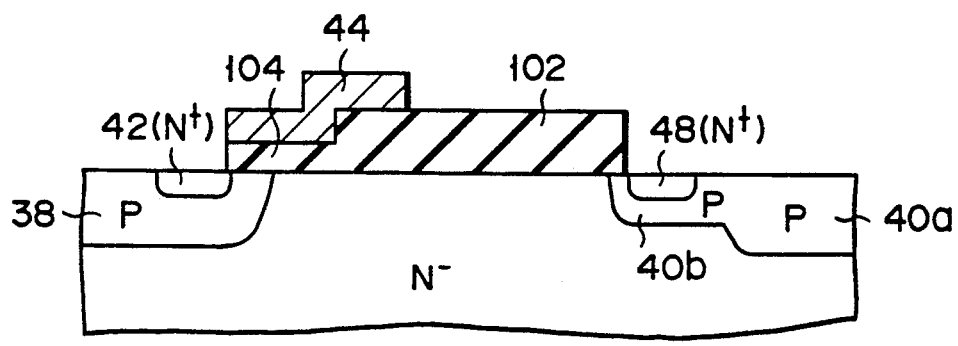
Figure 17F:
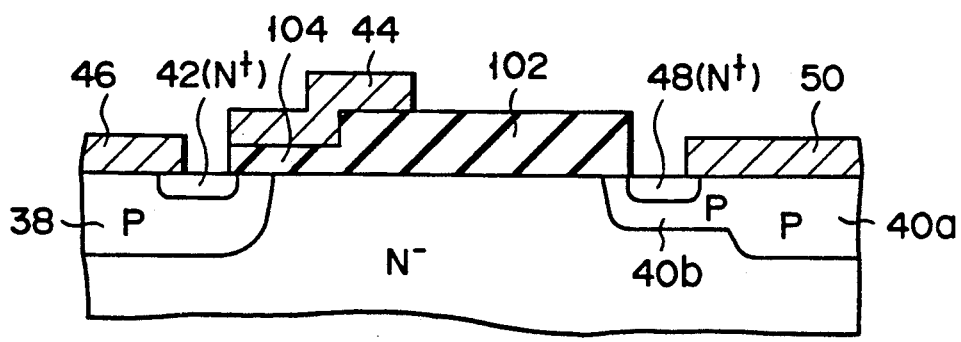

As shown in FIG. 17E, an N type impurity such as phosphorus or arsenic ions are implanted in selected regions of the layers 38 and 40, thus forming the N+ source layer 42 and the N+ type diffusion layer 48. At the same time, the resistance of the gate electrode 44 is lowered by the ion implantation. Finally, as shown in FIG. 17F, electrode layers 46 and 50 are deposited to complete a MOSFET structure.

Figure 18:
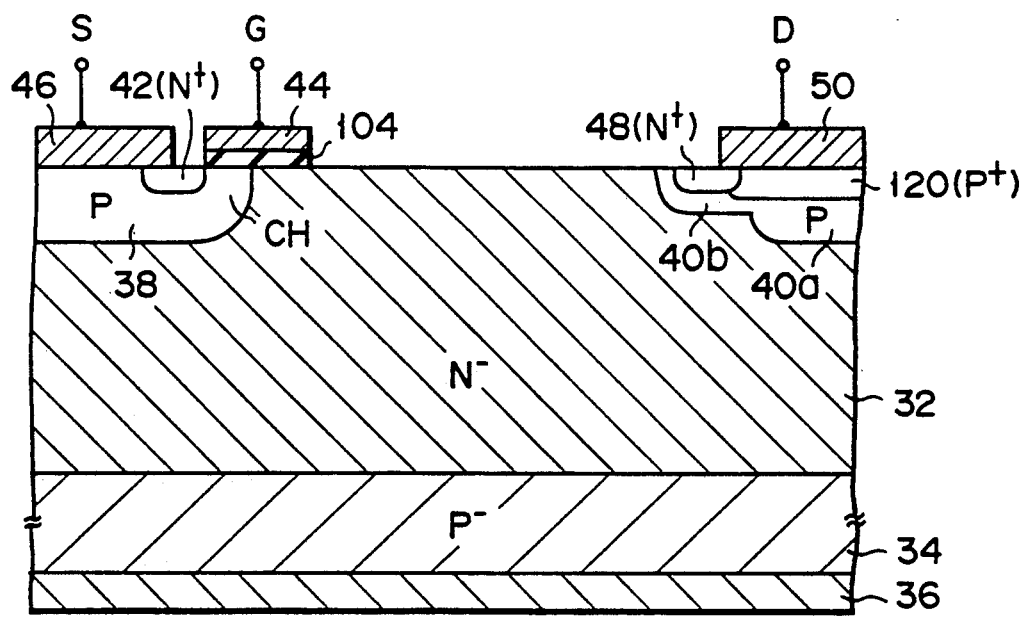
FIGS. 18 to 20 are diagrams showing conductivity modulation MOSFETs in accordance with other embodiments.
Figure 19:
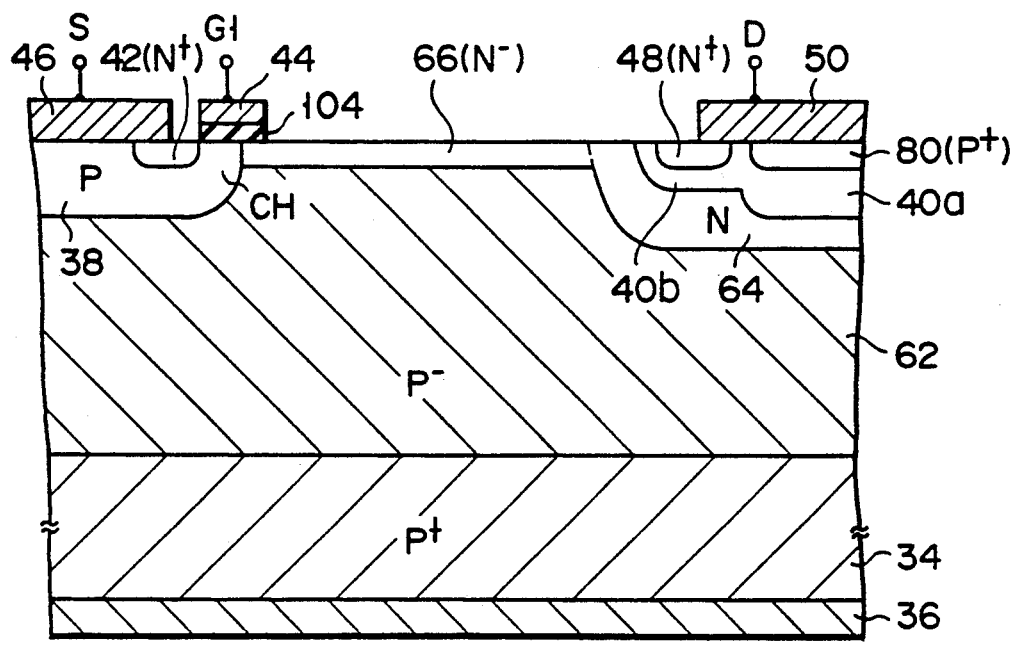
Figure 20:
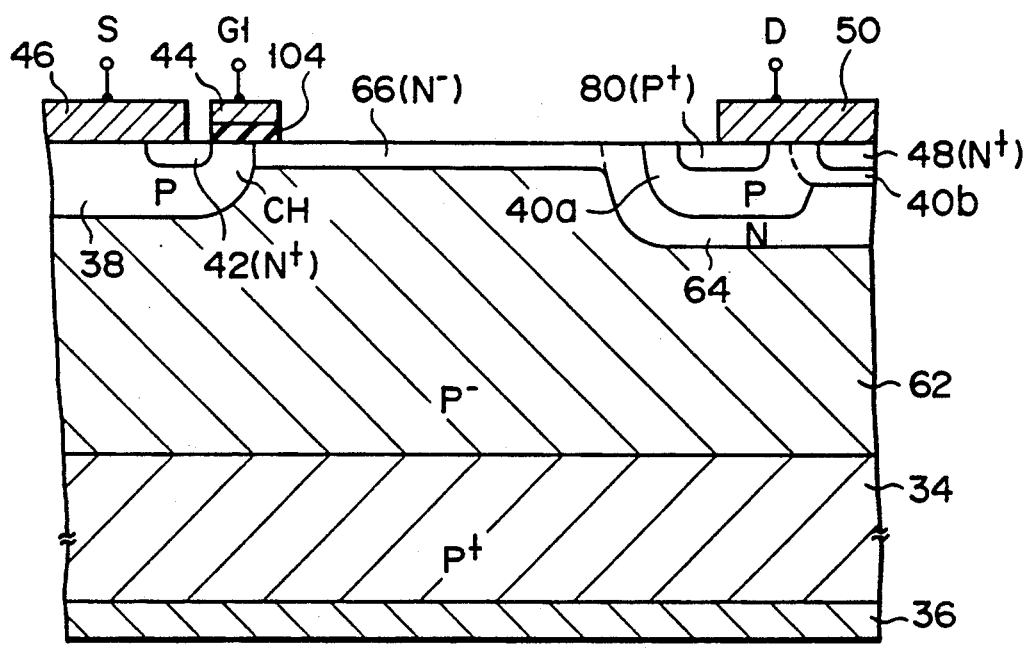

FIG. 18 shows a structure obtained by additionally forming an P+ type diffusion layer 120 in the MOSFET shown in FIG. 16. This layer 120 is formed in the P drain layer 40 consisting of the deep and shallow layers 40a and 40b, and is in contact with the N+ diffusion layer 48. FIGS. 19 and 20 show modifications to which the above-mentioned combination P drain structure of the deep and shallow layers 40a and 40b is applied. In the MOSFET shown in FIG. 19, formation positions of the layers 48 and 80 are set in the same manner as in the embodiment shown in FIG. 14.

In the method o manufacturing the MOSFET shown in FIGS. 17A to 17F, the deep and shallow layers 40a and 40b in the P type drain layer 40 are simultaneously formed by one thermal diffusion step. In the MOSFET structure in which the N type drain isolating layer 104 is additionally formed as shown in FIGS. 19 and 20, however, it is preferable to separately perform the thermal diffusion step for the layers 40a and 40b. The reason for this is as follows. In the structures shown in FIGS. 19 and 20, an impurity dose Qn of an N type isolating layer 64 formed under the P drain diffusion layer 40 adversely affects a withstand voltage and ON-voltage characteristics of an element. For example, in order to set the element withstand voltage to be 500 V or more, the dose Qn must be set to be $1 \times 10^{12}$ ions/cm$^2$ or more. On the other hand, in order to set a turn-on voltage of the element to be 3 V or less when the ON-current density is 100 A/cm$^2$, the dose Qn must be set to be $1 \times 10^{13}$ ions/cm$^2$ or less. In the method of thermally diffusing the deep and shallow layers 40a and 40b in the P type drain layer 40 at the same time, the impurity dose Qn of the N type layer and an impurity dose Qp of the P type layer formed under the N+ type diffusion layer 48 must be simultaneously controlled by the thermal diffusion step. Therefore, a control operation is extremely difficult.

Figure 21A:
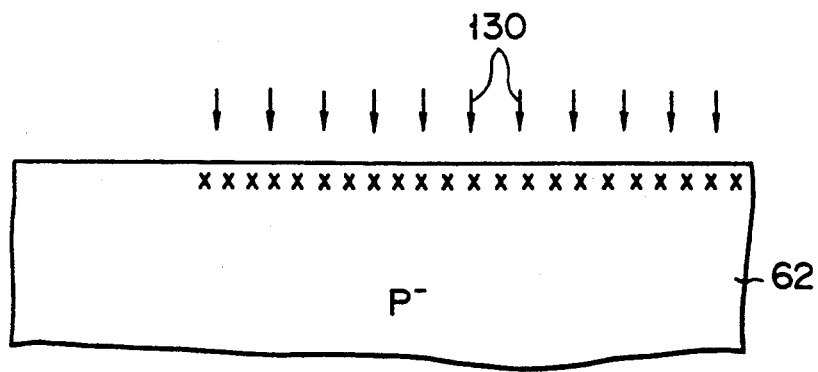
FIGS. 21A to 21H are diagrams showing some sectional structures obtained in the main steps of another manufacturing process of the MOSFET.
Figure 21B:
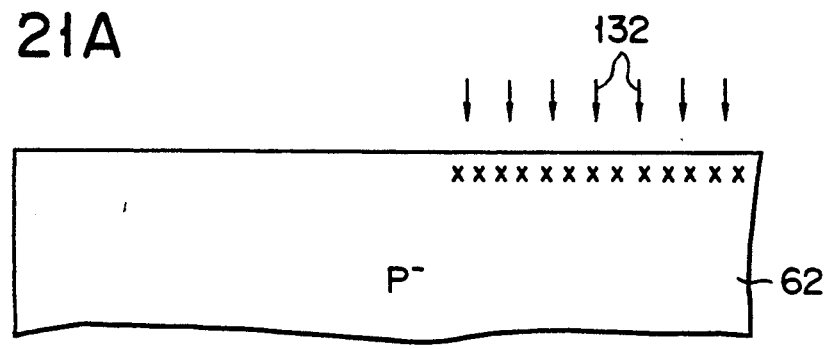
Figure 21C:
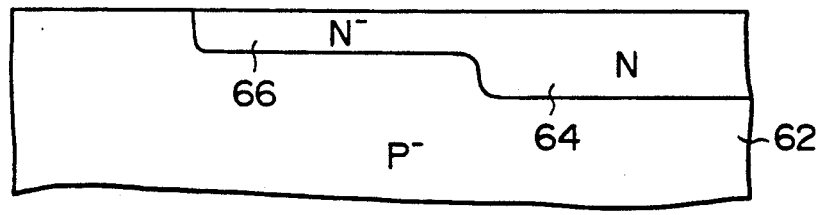
Figure 21D:
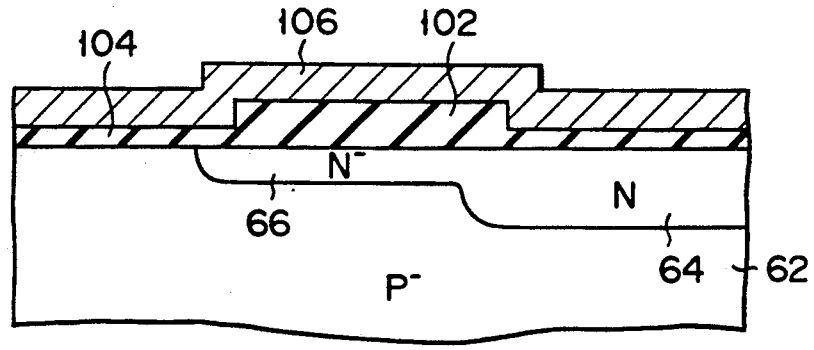
Figure 21E:
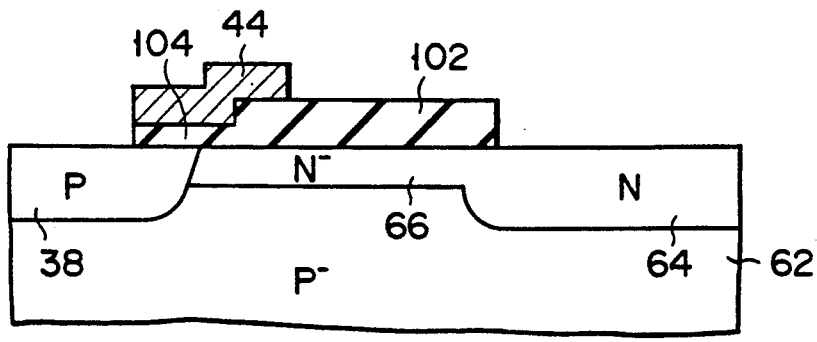
Figure 21F:
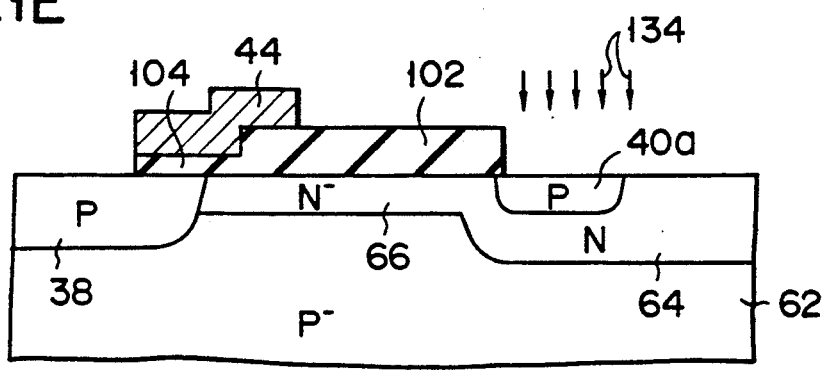
Figure 21G:
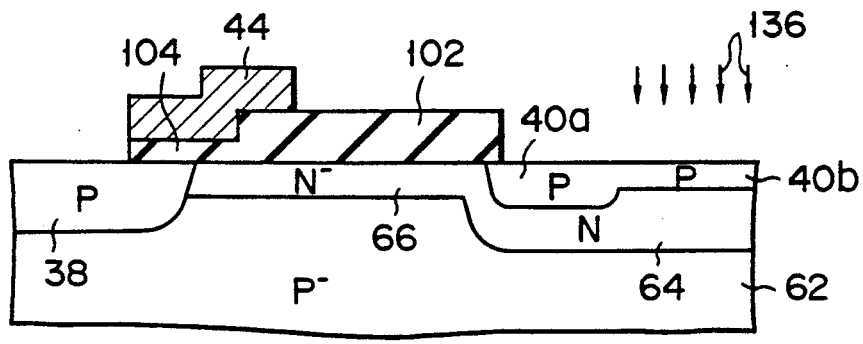
Figure 21H:
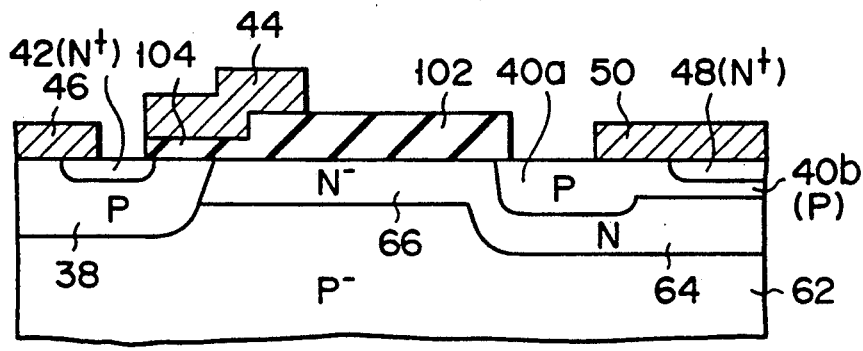

FIGS. 21A through 21H shown main steps in the embodiments of a manufacturing method for solving the above problems by thermally diffusing the deep layer 40a in the P type drain layer 40 prior to diffusion for the shallow layer 40b. As shown in FIG. 21A, phosphorus ions are selectively implanted in a surface of the P− type layer 62 at a dose of $0.5 \times 10^{12}$ to $5 \times 10^{12}$ ions/cm$^2$, as indicated by arrows 130. As shown in FIG. 21B, phosphorus ions are selectively implanted at a dose of $1 \times 10^{13}$ to $1 \times 10^{14}$ ions/cm$^2$, as indicated by arrows 132. Thereafter, thermal diffusion is performed at 1,200° C. for 6 hours to form an N− type layer 66 and the N type isolating layer 64, as shown in FIG. 21C. Then, the thermal oxide film 102 is formed on the wafer, and the oxide film 102 is selectively etched to form the gate oxide film 104 having a small thickness. Thereafter, as shown in FIG. 21D, the polysilicon film 106 is deposited on the entire surface. After the polysilicon film 106 is selectively etched to form the gate electrode 44, the P type base layer 38 is formed by the implantation of boron ions and thermal diffusion (see FIG. 21E). Then, as indicated by arrows 134, boron ions are selectively implanted in the N type isolating layer 64 at a dose of $0.5$ to $3 \times 10^{15}$ ions/cm$^2$. Thermal diffusion is performed at 1,100° C. for 2 hours to form the deep P type drain layer 40a (see FIG. 21F). In addition, as indicated by arrows 1136, boron ions are selectively implanted in the N type isolating layer 64 at a dose of $1 \times 5 \times 10^{13}$ ions/cm$^2$. Thermal diffusion is performed at 1,100° C. for 3 hours to form the shallow layer 40b in the P type drain layer 40 (see FIG. 21G). Phosphorus ions are selectively implanted in the P type base layer 38 and the shallow drain layer 40b, and annealing is performed to form the N+ type source layer 42 and the N+ type diffusion layer 48. Finally, the source and drain electrodes 46 and 50 are formed to complete the MOSFET (see FIG. 21H).

According to this embodiment, the impurity dose Qn of the N type isolating layer 64 under the P type drain layer 40 can be optimally set to be $1 \times 10^{12}$ ions/cm$^2$ to $1 \times 10^{13}$ ions/cm$^2$, and the impurity dose Qp of the P type drain layer under the N+ diffusion layer 48 can be optimally set to be 1 to $5 \times 10^{13}$ ions/cm$^2$.

The present invention is not limited to the above embodiments. For example, the conductivity type of each layer in the above embodiments may be reversed to obtain a P-channel type MOSFET, or the elements may be formed on a substrate with a dielectric isolating structure having a monocrystalline layer surrounded by the oxide film. In addition, a lateral conductivity modulation type MOSFET has been described in the above embodiments. However, in the vertical conductivity modulation type MOSFET in which a source and a gate are formed on one surface of a wafer, and a drain is formed on the other surface, the same effect as in the lateral MOSFET can be obtained by selectively forming, in a drain layer, a layer of an opposite conductivity type and having a depth smaller than that of the drain layer.

Figure 22:
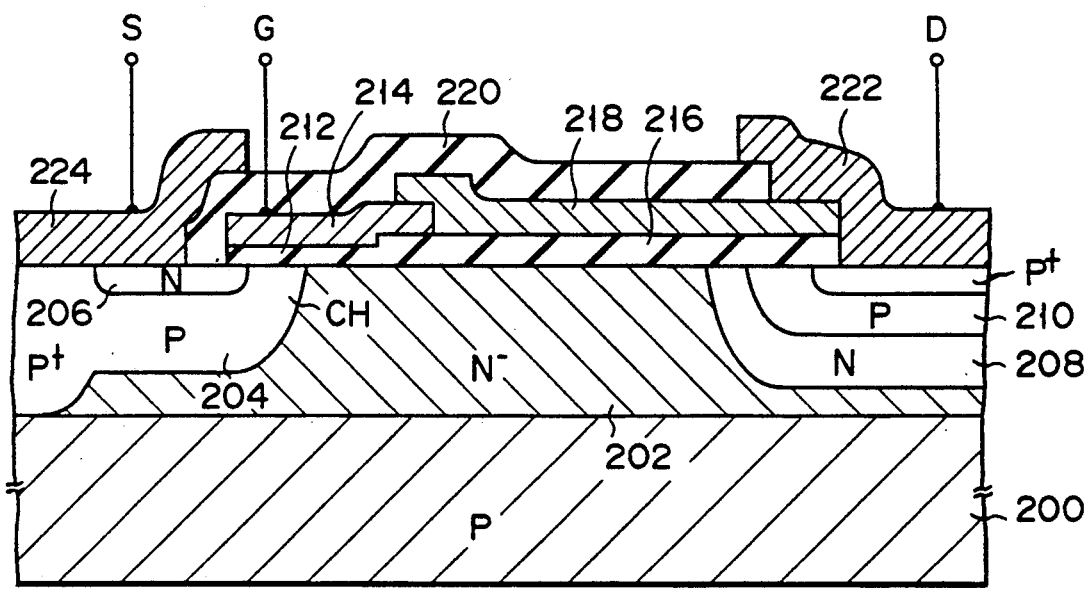
FIG. 22 is a diagram showing a sectional view of the main part of a basic structure of a lateral type conductivity modulation MOSFET.

A conductivity modulation type MOSFET 60 shown in FIG. 5 can be further improved as will be described later. FIG. 22 is a sectional view of a main part of a lateral conductivity modulation MOSFET with single gate structure using an epitaxial wafer structure according to a concept of the embodiment shown in FIG. 5.

As shown in FIG. 22, an epitaxial wafer obtained by forming an N− type epitaxial layer 202 on a P type silicon structure 200 is used in this MOSFET. A P type base layer 204 is formed on a surface of the N− type epitaxial layer 202. An N type source layer 206 is formed in the P type base layer 204. In the N− type layer 202, an N type drain isolating layer 208 is also formed to be spaced apart from the P type base layer 204 by a predetermined distance. A P type drain layer 210 is formed in the isolating layer 208. A surface of a region of the P type base layer sandwiched by the N type source layer 206 and the N− type epitaxial layer 202 serves as a channel region CH of the MOSFET. A gate insulation film 212 is formed on the channel region CH. A gate electrode 214 is formed on the film 212. An insulation film 216 is deposited on the wafer surface portion between the gate electrode 214 and the P type drain layer 210. A high resistivity thin-film layer 218 is formed on the insulation film 216. One end of the high resistivity thin-film layer 218 is connected to the gate electrode 214. The wafer surface is covered with a CVD insulation film 220. Contact holes are formed in the CVD insulation 220, and drain and source electrodes 222 and 224 are formed in these contact holes, as shown in FIG. 22. The drain electrode 222 is also connected to one end of the high resistivity thin-film layer 218.

In this lateral conductivity modulation type MOSFET, when a bias voltage which is positive with respect to the source electrode 224 is applied to the gate electrode 214, the channel region CH is inverted and electrons are injected into the N− type epitaxial layer 202 from the N type source layer 206. When the electrons flow into the P type drain layer 210, its P-N junction is forward-biased. As a result, holes are injected into the N− type epitaxial layer 202 from the P type drain layer 210. Thus, the electrons and holes are simultaneously accumulated in the N− type epitaxial layer 202, and so-called conductivity modulation is caused. Therefore, a turn-on resistance lower than that of the normal MOSFET can be obtained. When a bias voltage which is zero or negative with respect to the source electrode 224 is applied to the gate electrode 214, the inversion layer of the channel region CH disappears, and the element is turned off.

The high resistivity thin-film layer 218 serves to reduce the local concentration of an electric field in the wafer, since a small current is allowed to flow in this layer 218 under a turn-off condition of the element wherein voltage difference appears between the drain and the source of the element. Continuous current flowing in layer 218 creates some degree of gradient in the electric field in the wafer, which may result in the electric filed being moderated. Voltage breakdown due to the local concentration of electric field can thus be eliminated.

In such a conductivity modulation type MOSFET, a PNPN junction consisting of the P type drain layer 210, the N⁻ type epitaxial layer 202, the P base layer 204, and the N type source layer 206 serves as a parasitic thyristor. When this parasitic thyristor is turned on, a turn-off control operation by the gate electrode 214 cannot be performed. This is a so-called "latch-up" phenomenon. Since the latch-up phenomenon of the parasitic thyristor causes element breakdown, a latch-up current is preferably set as high as possible in the conductivity modulation type MOSFET. The parasitic thyristor is turned on because the holes injected from the P type drain layer 210 pass through the P base layer 204 in the thyristor electrically connected to the source electrode 224. A hole current is supplied to the P base layer 204, and a voltage drop is caused across a resistive component immediately under the P base layer 204. When this voltage drop is sufficiently high to forward-bias the P-N junction between the N type source layer 206 to the P base layer 204, thus turning on the thyristor. Therefore, in order to prevent a latch-up phenomenon of the parasitic thyristor, a lateral resistive component of the P base layer 204 is preferably set as small as possible. In order to achieve this, the impurity density of the P base layer 204 may be increased. In the P base layer 204, however, its surface portion is also utilized as the channel region CH. Therefore, the impurity density of the layer 204 cannot be uselessly increased in order to optimally set the threshold values of the element. In addition, since the elements shown in FIG. 22 are formed using the epitaxial wafer, it takes a long time to manufacture the elements, and cost becomes high.

The embodiment shown in FIG. 23 is proposed in order to solve the above-mentioned technical problems, and the feature of this embodiment is as follows. In this embodiment, an N⁻ type low impurity density diffusion layer 230 is formed on a wafer surface which overlaps the N type drain isolating layer 208 and the source layer 206 in place of the above-described epitaxial layer 202.

With such an arrangement, the impurity density of the P base layer 204 can be increased and its lateral resistance can be reduced without increasing the threshold voltage of the element. This is because, unlike the epitaxial layer 202, the diffusion layer 230 has an impurity density gradient in a depth direction. Therefore, if the impurity dose remains the same, the impurity density near the surface can be set higher than that of the epitaxial layer 202. Therefore, when the surface density of the prospective channel region CH on the surface of the P base layer 204 is equal to that in the conventional case, i.e., the threshold voltage is equal to that in the conventional case, the impurity density in the P base layer 204 can be increased without increasing the threshold voltage. In addition, since no epitaxial wafer is used in this embodiment, manufacturing cost for the elements can be decreased.

This embodiment will be described in detail hereinafter with reference to FIG. 23. Note that the reference numerals in FIG. 23 denote the same parts as in FIG. 22, and a repetitive description thereof will be omitted.

As is apparent from a comparison between FIGS. 22 and 23, the N type diffusion layer 230 formed by utilizing impurity diffusion from the wafer surface is used in this embodiment in place of the N⁻ type epitaxial layer 202 in FIG. 22. The impurity density of the N type diffusion layer 230 is set to be, e.g., about $2 \times 10^{12}$ ions/cm³.

FIG. 24 is a graph showing a distribution of an impurity density on the wafer surface as a function of a distance from the n type source layer 206 toward the drain in the conductivity modulation type MOSFET in this embodiment. When the impurity dose of the N type diffusion layer 230 is equal to that of the above-mentioned N⁻ type epitaxial layer 202, their surface densities are as follows. The density in the embodiment (solid line) shown in FIG. 23 is higher than that in the embodiment (broken line) shown in FIG. 22. Therefore, in the surface portion of the P base layer 204, i.e., the channel region CH, a practical impurity density (carrier density) is lower than the impurity density (broken line) doped in practice, due to a cancellation effect of the N type impurity. This means that the impurity density of the P base layer 204 can be increased as compared with the conventional density to obtain a threshold voltage of the conductivity modulation type MOSFET equal to the conventional value. As a result, in the embodiment shown in FIG. 23, when the threshold voltage is equal to that in the embodiment shown in IG. 22, a lateral resistive component of the P base layer 204 formed immediately under the N type source layer 206 can be decreased. Therefore, the conductivity modulation type MOSFET without latching up to a large current can be obtained. In addition, since no epitaxial wafer is used in this embodiment, manufacturing cost for the element can be reduced.

The MOSFET shown in FIG. 23 can be modified, as shown in FIG. 25, wherein the N type diffusion layer 230 is selectively formed on the wafer surface, unlike in the embodiment shown in FIG. 23. More specifically, the N type diffusion layer 230 is formed to cover only a partial wafer surface between the N type drain isolating layer 208 and the channel region CH of the P base layer 204. An arrangement of the remaining portions is the same as in the embodiment shown in FIG. 23.

Since the N type diffusion layer 230 is formed on a part of the region of the P base layer 204 immediately under the N type source layer 206 in this embodiment, a base lateral resistive component of the base immediately under the N type source layer 206 is further decreased. Therefore, a latch-up phenomenon is not caused up to a further increased large current. An effect of this embodiment will be maximized when a gate side edge serving as a diffusion window upon formation of the N type source layer 206 coincides with a base side edge serving as a diffusion window upon formation of the N type diffusion layer 230.

FIG. 26 shows a lateral conductivity modulation type MOSFET formed on a substrate obtained by forming the N⁻ type epitaxial layer 202 having a low impurity density on a P substrate. In this embodiment, the N type diffusion layer 230 is formed to partially overlap the P base layer 204. With such an arrangement, a lateral resistance of the N⁻ type epitaxial layer 202 formed immediately under the P base layer 204 can be kept small. In addition, by additionally forming the N type diffusion layer 230, an impurity density of a wafer surface portion is decreased. Therefore, the channel region CH of the P base layer 204 can be decreased, as shown in FIG. 26. As a result, a lateral resistive component of the P base layer 204 can be further decreased, and a channel resistance can also be reduced. This contributes to a phenomenon of the turn-on voltage of the element. When an impurity dose in a depth direction per unit wafer area (i.e., an integral value of the impurity density in a wafer depth direction) of a part of the epitaxial layer 202 having a low impurity density located between the P base layer 204 and the N type drain isolating layer 208 is set to be $2 \times 10^{12}$ ions/cm² or less, and that of the N type diffusion layer 230 is set to be substantially equal to the above value, the withstand voltage of the element can be maximized.

What is claimed is:

1. A semiconductor device comprising:
   a semiconductor substrate;
   a conductivity-modulation field effect transistor formed on said substrate, said transistor having a base region of a first conductivity type, a source region of a second conductivity type formed in one portion of said base region, a source electrode for electrically connecting said base region and said source region with each other, a drain region of the first conductivity type formed in another portion of said base region, a drain electrode formed on said drain region, and a gate electrode insulatively provided above said substrate on a channel region formed between source and drain regions; and
   means for, when said transistor is turned off, facilitating carriers in said device to flow into said drain electrode, thereby accelerating dispersion of the carriers in said transistor, said means comprising a first heavily-doped semiconductive layer of the second conductivity type which is formed in said drain region to have a conductivity type opposite to that of said drain region, said semiconductive layer being in contact with said drain electrode.

2. The device according to claim 1, wherein said substrate has a surface in which said base region an said drain region are formed.

3. The device according to claim 2, further comprising:
   a second heavily-doped semiconductive layer which is formed in said drain region to overlap the first heavily-doped semiconductive layer, said second semiconductive layer having a conductivity type opposite to that of said first semiconductive layer.

4. The device according to claim 2, further comprising:
   a second heavily-doped semiconductive layer which is formed in said drain region to be contact with said drain electrode, said second semiconductive layer having a conductivity type opposite to that of said first semiconductive layer.

5. The device according to claim 4, further comprising:
   a third heavily-doped semiconductive layer having the conductivity type opposite to that of said source region and which is formed in said substrate so as to overlap said base region and said source region and to be in contact with said source electrode.

6. A single-gate type conductivity-modulation field effect transistor comprising:
   a first base layer having a surface;
   a second base layer of a first conductivity type provided in the surface of said first base layer;
   a source layer provided in said second base layer;
   a source electrode provided on the layer surface, for electrically shorting said second base layer with said source layer;
   a drain layer having said first conductivity type provided in said layer surface;
   a drain electrode formed on said layer surface to be in contact with said drain layer;
   a gate electrode insulatively provided above said layer surface, for covering a certain surface portion of said second base layer which is positioned between said first base layer and said source layer to define a channel region below said gate electrode; and
   a heavily-doped semiconductor layer of a second conductivity type which is provided in a selected surface portion of said drain layer and which is included in said drain layer to be in contact with said drain electrode, said heavily-doped semiconductor layer facilitating, when said transistor is turned off, carriers accumulated in said first base layer to flow into said drain electrode through said drain layer, thereby accelerating dispersion of the carriers in said transistor; and
   wherein said first base layer and said source layer have said second conductivity type.

7. The transistor according to claim 6, wherein said drain layer comprises heavily-doped drain layer portions each pair of two adjacent layer portions of which are separated from each other.

8. The transistor according to claim 7, wherein said source layer has one side portion along which a plurality of projected layer portions are aligned to define a comb-shaped planar pattern.

9. The transistor according to claim 6, further comprising:
   a high-resistive layer insulating provided above said layer surface and connected with said source electrode and said drain electrode.

10. The transistor according to claim 6, wherein said drain layer comprises:
    a first diffusion layer; and
    a second diffusion layer which at least partially surrounds said heavily doped semiconductor layer and which has its depth smaller than that of said first diffusion layer, said second diffusion layer formed adjacent said first diffusion layer.

11. The transistor according to claim 10, further comprising:
    a second heavily doped semiconductor layer of a conductivity type which is the same of that of said drain layer and which is formed in said first diffusion layer.

12. The transistor according to claim 11, wherein said second heavily doped semiconductor layer is in contact with said drain electrode.

* * * * *